(12) United States Patent
Calafut

(10) Patent No.: US 6,673,680 B2
(45) Date of Patent: Jan. 6, 2004

(54) FIELD COUPLED POWER MOSFET BUS ARCHITECTURE USING TRENCH TECHNOLOGY

(75) Inventor: Daniel S. Calafut, Sunnyvale, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 50 days.

(21) Appl. No.: 10/105,721

(22) Filed: Mar. 25, 2002

(65) Prior Publication Data

US 2002/0102795 A1 Aug. 1, 2002

Related U.S. Application Data

(62) Division of application No. 09/014,115, filed on Jan. 27, 1998.

(51) Int. Cl.[7] .................. H01L 21/336; H01L 21/3205; H01L 21/4763
(52) U.S. Cl. .................. 438/270; 438/268; 438/589
(58) Field of Search .................. 438/268–274, 438/259, 588–589; 257/328–332, 335, 339, 140, 146, 147, 212, 144

(56) References Cited

U.S. PATENT DOCUMENTS

| | | | |
|---|---|---|---|
| 4,697,201 A | | 9/1987 | Mihara |
| 4,914,058 A | | 4/1990 | Blanchard |
| 4,942,445 A | * | 7/1990 | Baliga et al. ............. 257/141 |
| 4,994,883 A | * | 2/1991 | Chang et al. ............. 257/288 |
| 5,072,266 A | * | 12/1991 | Bulucea et al. ........... 257/330 |
| 5,321,289 A | | 6/1994 | Baba et al. |
| 5,541,430 A | | 7/1996 | Terashima |
| 5,557,127 A | | 9/1996 | Ajit et al. |
| 5,602,046 A | | 2/1997 | Calafut et al. |
| 5,665,996 A | | 9/1997 | Williams et al. |
| 5,894,149 A | | 4/1999 | Uenishi et al. |
| 5,972,741 A | | 10/1999 | Kubo et al. |

FOREIGN PATENT DOCUMENTS

| | | |
|---|---|---|
| EP | 0594177 | 4/1994 |
| JP | 57018365 | 1/1982 |

OTHER PUBLICATIONS

Goodenough, Frank, "Small Packages on Tap for Low–Voltage Power MOSFETs", *Electronic Design*, pp. 103–110, (Jun. 9, 1997).

Baba, et al, "A Study on High Blocking Voltage UMOS–FET With a Double Gate Structure", Published May 19, 1992 & Presented at 1992 International Symposium on Power Semiconductor Devices & ICs, Tokyo, pp. 300–302.

\* cited by examiner

*Primary Examiner*—Shouxiang Hu
(74) *Attorney, Agent, or Firm*—Thomas R. FitzGerald, Esq.

(57) ABSTRACT

A power metal oxide semiconductor-field-effect-transistor (MOSFET) device using trench technology to achieve a reduced-mask-production process. The power MOSFET device includes a gate signal bus having multiple gate trenches formed using fewer masks than previously required for a similar device. The two-dimensional behavior of the trenches provides an advantageous field-coupling effect that suppresses hot-carrier generation without the need for the commonly used thick layer of silicon dioxide beneath the gate polysilicon. The use of easily controlled silicon trench etching in production of the power MOSFET results in stable, low cost, and high yielding manufacturing.

6 Claims, 4 Drawing Sheets

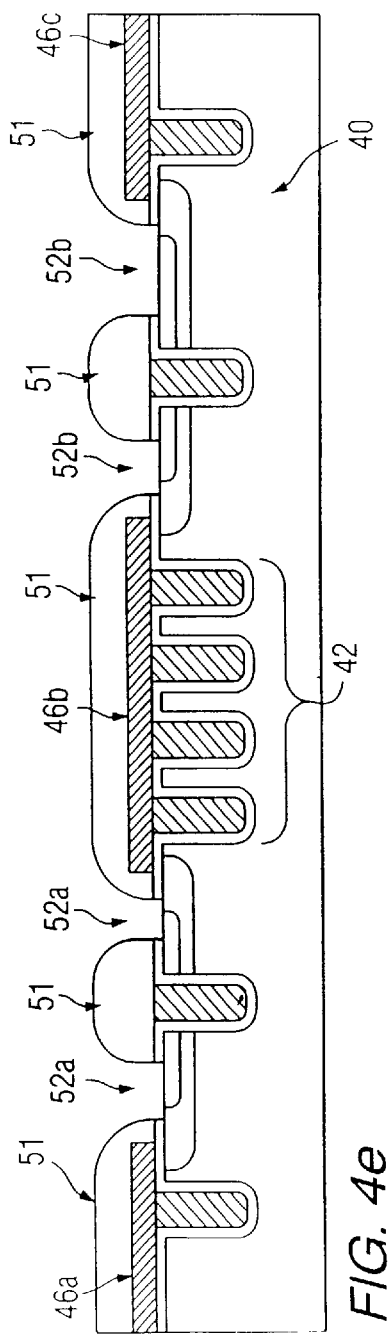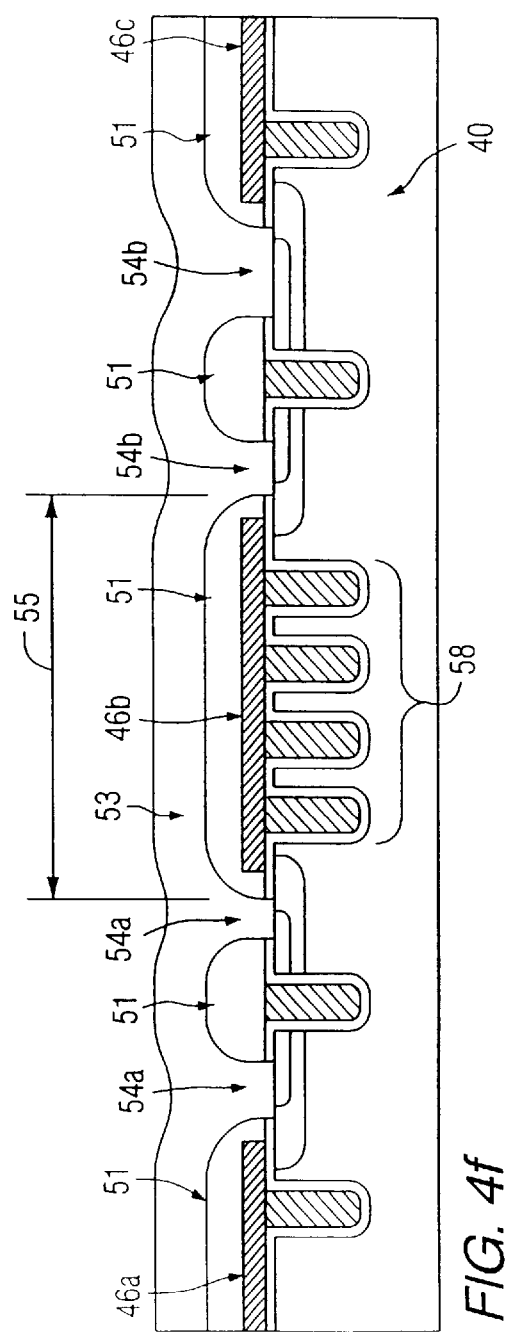

FIELD COUPLED POWER MOSFET BUS ARCHITECTURE USING TRENCH TECHNOLOGY

CROSS-REFERENCE TO RELATED APPLICATIONS

This application is a division of U.S. patent application Ser. No. 09/014,115, filed Jan. 27, 1998.

BACKGROUND OF THE INVENTION

1. Field of the Invention

The present invention relates to the field of power semiconductor devices. More particularly, the present invention relates to a semiconductor device employing double-diffused metal oxide semiconductor (DMOS) type technology used to construct field effect transistor (FET) devices. Moreover, the present invention relates to a structure which uses trench DMOS-FET technology to implement such devices. Still more particularly, the present invention provides for a redesigned gate signal bus, where MOS trenches are arranged in parallel formation to effect an electric field coupling between the trenches, resulting in a reduction of the peak electric field in the area around the gate signal bus.

2. Description of the Prior Art

MOS devices, particularly MOS field effect transistors (MOSFETs), represent a fundamental component of any contemporary electronic system. MOSFETs are distinguished from power MOSFETs in that power MOSFETs can dissipate more than 0.5 W and are physically larger than typical MOSFETs. Those power MOSFETs having a drain-to-source voltage of less than 150V are generally identified as low-voltage power MOSFETs and are typically used in "power management" applications. Such applications include, but are not limited to, power switches, switching regulators, and linear regulators. It is this type of power MOSFET that is the focus of the present invention.

One type of power MOSFET is a double-diffused type FET sometimes called a DMOS transistor. DMOS transistor fabrication uses diffusion to form the transistor channel regions. A power MOSFET is essentially a large array of unit-cell DMOS transistors with several additional elements to evenly distribute gating signals and control device breakdown voltage. DMOS devices have the advantage of providing low-power dissipation and high-speed capability. Accordingly, DMOS technology is preferred in high-voltage circuitry of today's high-power integrated circuit applications. Applications in which such power MOSFETs utilizing DMOS technology are found range from high-voltage telecommunication circuits down to 3.3 volt DC-DC converters used on personal computers. Devices utilizing DMOS technology have been common throughout these applications for nearly 20 years. Many advances in DMOS technology regarding the device fabrication and device characteristics have also occurred during this period. Currently, power MOSFETs represent the third fastest growing market in the world. Performance gains are achieved by cell-density increases, which mean decreasing unit cell dimensions. Because the market for power MOSFETs is high volume and price-competitive, a premium is placed on manufacturing innovation leading to stable, low cost, and high-yielding production processes.

In the field of power MOSFET production, there have been a variety of other processes utilized. For production of the dominant device structure for DMOS power MOSFETs, there has existed the so-called "planar process" of production. The planar process derives its name from the fact that the MOSFET channel and gating structures are coplanar with the silicon wafer surface. In FIG. 1, a prior art DMOS structure is shown in the form of a planar DMOS structure 10 produced by the planar process. This planar structure is predominant in mainstream production of DMOS power MOSFETs. In FIG. 1, the DMOS structure 10 includes a channel 12 and a gating structure 13. Both the channel 12 and gating structure 13 are coplanar to a silicon-wafer surface 11. Although the planar process has been well refined over the years, it exhibits considerable scaling limitations. Such limitations are becoming particularly apparent when the planar process is scaled to small-cell dimensions. As performance gains in power MOSFETs are obtained by increasing cell density—and thus decreasing unit-cell dimensions—the limitations in the planar process approach for such planar DMOS devices appear far sooner than the equipment's photo lithographic limitations. This problem stems from the polysilicon gate that is used to control the power MOSFET's channel characteristics. Basically, the gate dimension for a given junction depth cannot be reduced indefinitely without forcing the so-called JFET resistance term to become a dominating constituent of the device's overall ON-state resistance—a key parameter. The JFET resistance term gains its name from an inherent, parasitic junction field effect transistor (JFET) operation that arises from the nature of the structural junctions between the layers.

Concurrent with the development of the prior art planar process described above, other technology has been developed with the goal of keeping the JFET resistance term from becoming a dominating constituent. More particularly, an emerging technology in power MOSFET production avoids the JFET problem by forming the device's channel along the sidewalls of an etched trench. This alternative prior art design is shown in FIG. 2 and includes a trench DMOS structure 20. The trench DMOS structure 20 includes a gate channel 22 along the sidewalls 25 of a trench 24 beside gate 23. This trench 24 is etched into the silicon wafer surface 21 so that the channel 22 is positioned perpendicular to the silicon wafer surface 21. This type of production process is appropriately named "trench DMOS technology," or simply "trench technology." A benefit of this trench technology is that it virtually eliminates the JFET problem. It permits increases in cell density by orders of magnitude, the only limitation then being that imposed by the fabrication equipment.

In typical power MOSFET structures, the width of the depletion region determines the electric field that exists across the region and hence the voltage drop. Therefore, any applied voltage beyond this magnitude must be partially dropped across the thin gate oxide layer. If this becomes too great, hot electron generation can occur, which can lead to an irreversible device breakdown. Typically, this is alleviated by placing a thick layer (e.g., 8500 Å) of thermally grown silicon dioxide underneath the polysilicon gate. This additional oxide layer is not inconsequential. It effectively represents one to three additional photomasking steps and a relatively long thermal cycle for its growth. In some cases, a thermal cycle upwards of nine hours is needed. Further, this additional oxide layer is commonly found to be a significant source of ionic contaminants. Such contamination can ultimately adversely influence the given device's reliability. The use of trench technology in the power MOSFET structure of the present invention eliminates the need for this additional oxide layer.

Trench technology has not heretofore been utilized to its fullest extent. One area in which trench technology has not been utilized is in power MOSFET bus architecture. Contemporary production power MOSFETs, using trench—or other—technology, require a thick field oxide layer beneath the polysilicon gate bus structure to suppress hot electron injection. Another method to address this problem includes forming impurity junctions within the gate bus. That method would also suggest a field-coupling mechanism. This, however, requires more area for the gate bus since holes must be etched into the polysilicon bus to allow implanted ions into the silicon surface below. Furthermore, these junctions would be electrically floating and, hence, would not have a well-defined potential voltage. This can lead to dynamic performance degradation since bulk carriers near the junction can be modulated under certain bias conditions.

Accordingly, the prior art fails to provide any MOSFET bus architecture capable of efficient utilization of trench technology. Therefore, what is needed is a method of MOSFET device production that utilizes trench technology to redesign an element of that device—namely, the gate signal bus. What is needed is such MOSFET device production that results in the formation of a value supported by the underlying epitaxial layer. Further, what is needed is such a method that ensures a production process that is shortened and thus less costly. It is the capability to fabricate efficiently an effective bus architecture that would make the use of trench technology desirable.

SUMMARY OF THE INVENTION

It is an object of the present invention to provide a power MOSFET bus architecture made with trench technology. Another object of the present invention is to provide a process for producing such a bus architecture. Yet another object of the present invention is to provide such a bus architecture with MOS trenches having enhanced depletion region widths. Still another object of the present invention is to provide a bus device capable of withstanding voltages up the maximum value supported by the epitaxial layer underlying the bus device. It is also an object of the present invention to provide such a bus device that is more quickly and cost-effectively produced than the comparable prior art devices utilizing trench technology.

The present invention focuses on using trench technology to redesign a gate signal bus of a power MOSFET device. The innovation in bus architecture is accomplished by using MOS trenches placed in such a way so as to couple the depletion region widths of the trenches to one another. Such placement thus forms a structure capable of withstanding voltages up to the maximum value supported by the underlying epitaxial layer. The generation of the depletion layer, characteristic of all MOS structures, is critical to the success of this approach of the present invention. The nature of each depletion region and thus the means of coupling of depletion region widths together in the present invention depends on both the applied voltage across the MOS system and the semiconductor dopant concentration. These factors are determined by the specifications demanded by the device using that MOS system. The spacing between the trenches is a key factor in depletion region width coupling. Accordingly, the spacing of trenches will be influences by the demands of the final device.

The trench process utilized in the present invention results in a reduction in the number of masks required to produce a power MOSFET device. Present techniques commonly require up to nine (photo) masking steps to fabricate a device. The present invention reduces the required masking steps by one. It also removes a relatively long thermal oxide formation process.

A distinguishing feature of this type of "reduced-mask" device is the current-conduction-path. Rather than being lateral as in conventional planar MOS devices, the current-conduction-paths in MOS devices of the present invention are vertical paths—through the epitaxial layer and the substrate. Further, in the present invention, the channel junctions are self-aligned to the polysilicon and trenches. Initial simulations and experimentation provided suitable results via trench dimensions of two microns of depth by one micron of width. Initial simulations were performed with the MEDICI 2 dimensional device simulator and prototyped in an edge-termination structure. The field coupling effect that allows the reduced mask to occur is a result of the two-dimensional behavior of trench technology. Because silicon trench etching can be controlled quite easily in production, the present invention is a valuable approach for power MOSFET bus device production.

Enhanced voltage protection occurs in the present invention through the coupling of the depletion regions of each trench that forms the gate bus. Within a given gate bus, there will be multiple trenches formed below a single polysilicon surface structure. Each trench contributes a depletion region within each space of—epitaxy substrate material between adjacent gate trenches, so as to create an expanded depletion region. The resultant increase in the collective depletion region provides the gate bus with the ability to support an increased voltage during normal operation conditions. Such enhanced overvoltage protection is accomplished via the structural arrangement of the trenches and is easily controlled by determination of spacing for any given application.

It is to be understood that other objects and advantages of the present invention will be made apparent by the following descriptions of the drawings according to the present invention. While a preferred embodiment is disclosed, this is not intended to be limiting. Rather, the general principles set forth herein are considered to be merely illustrative of the scope of the present invention and it is to be further understood that numerous changes may be made without straying from the scope of the present invention.

BRIEF DESCRIPTION OF THE DRAWINGS

FIGS. 4a to 4f are a series of schematics showing the trench process utilizing in a gate signal bus production according to the present invention.

DETAILED DESCRIPTION OF THE PREFERRED EMBODIMENT

Figure 3:
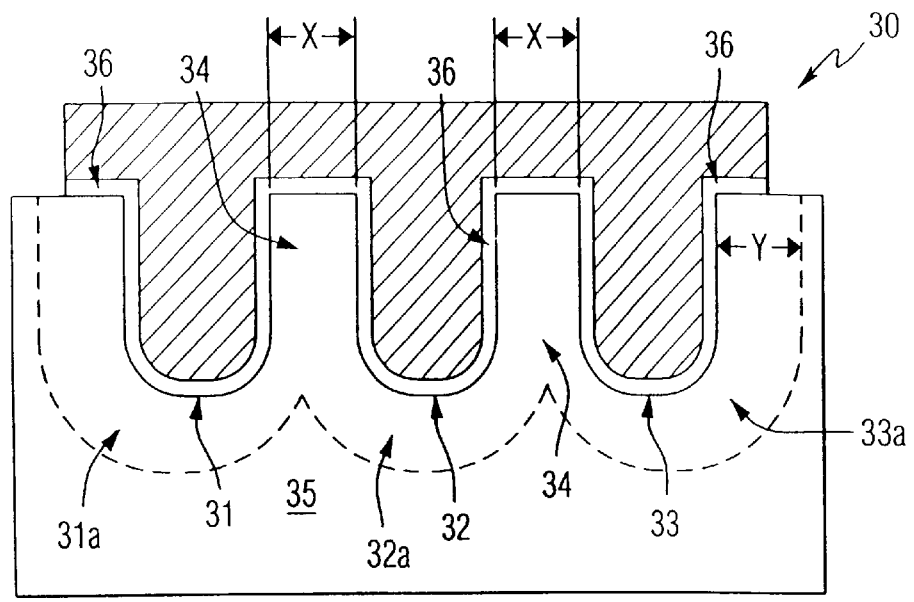
FIG. 3 is a schematic of a gate signal bus utilizing trenches in accordance with the preferred embodiment of the present invention, showing the mechanism for enhanced voltage protection.

In FIG. 3, the mechanism for enhanced over voltage protection is illustrated in accordance with the preferred embodiment of the present invention. In particular, FIG. 3 shows a power MOSFET gate signal bus 30 (shown simplified) utilizing trench technology. The gate signal bus 30 includes trenches 31, 32, and 33. These trenches 31, 32, and 33 are placed within an N+ substrate in parallel to one another and spaced apart by a distance X. Forming trenches 31, 32, and 33 in such a way creates a depletion region overlap 34 between adjacent trenches 31, 32 and 33 so as to couple the depletion region 31s with depletion region 32a and depletion region 32a with depletion region 33a. In this way, gate signal bus 30 is capable of withstanding voltages up to the maximum value supported by the underlying epitaxial layer 35. The generation of the depletion regions 31a, 32a, and 33a is a characteristic of all MOS structures and, in this case, is critical to the feasibility of the present invention. The nature of the depletion regions 31a, 32a, and 33a is well understood and known to be dependent upon the applied voltage across the MOS system as well as the semiconductor dopant concentration. Accordingly, the spacing distance X between the trenches 31, 32, and 33 is related to the required specifications that any given final device demands.

Figure 3A:
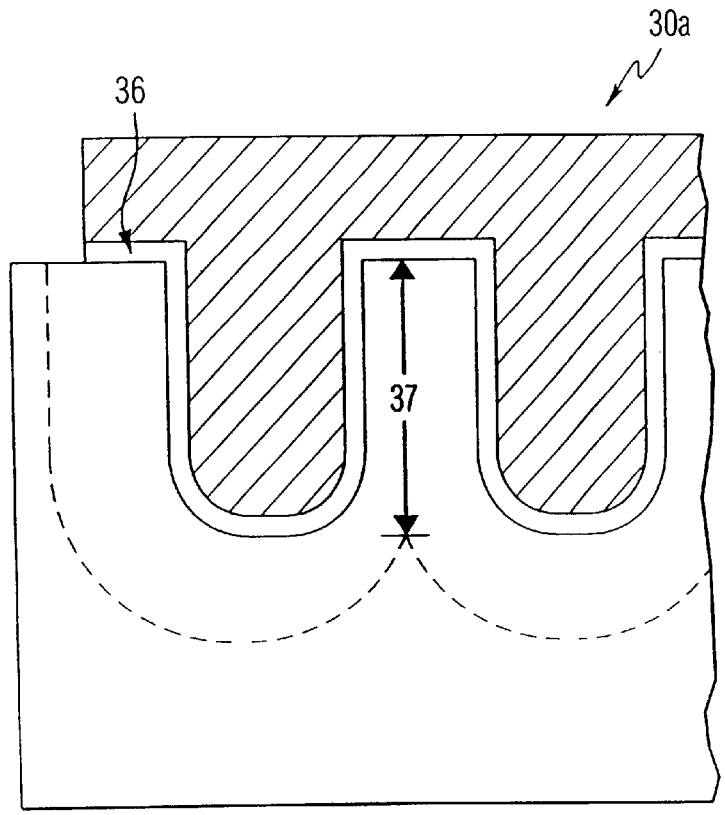
FIG. 3a is a partial cutaway close-up schematic of the gate signal bus as shown in FIG. 3, showing the mechanism for enhanced voltage protection as it relates to trench spacing.

With further reference to FIG. 3, each of the depletion regions 31a, 32a, and 33a have a depletion region width Y that determines the electric field that exists across the region and hence the voltage drop. Therefore, any applied voltage beyond that voltage drop must be partially dropped across the thin gate oxide layer 36. If this becomes too great, hot electron generation can occur, which can lead to an irreversible device breakdown. Although a thick layer of thermally grown silicon dioxide (not shown) is typically placed underneath the gate oxide layer 36 to prevent such breakdowns in planar structures and single trench structures, such an additional layer is typically both time consuming and costly. This extra layer is unnecessary in the present invention as illustrated in FIG. 3 because the overlap 34 of the depletion regions effectively extends the space charge boundary 37, as shown in FIG. 3a, due to the trench field coupling. FIG. 3a illustrates a section 30a of the gate signal bus 30 shown in FIG. 3.

Figure 4A:
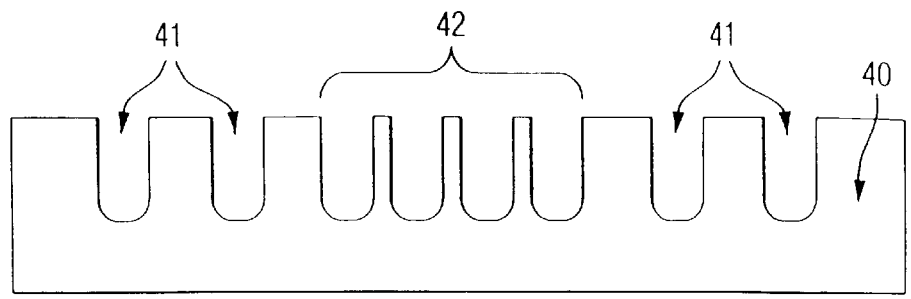
Figure 4B:
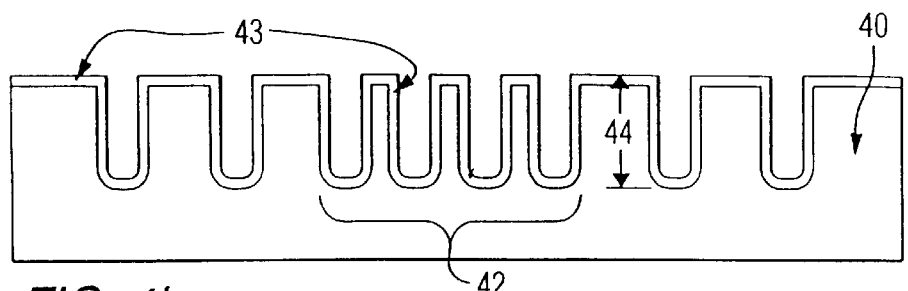

FIGS. 4a through 4f are a series of schematics showing steps in the production of a field coupled power MOSFET bus using trench technology in accordance with the preferred embodiment of the present invention. In FIG. 4a, a silicon surface 40 is shown having been formed with spaced-apart trenches 41. Any suitable method of formation may be utilized such as photoresist mask deposition with anisotropic etching. In particular with respect to the preferred embodiment, a central group 42 of closely aligned trenches 41 is formed. This central group 42 is the initial structure required to form a gate bus. Each trench 41 within the central group 42 is spaced apart by a predetermined distance X as discussed above with respect to FIG. 3. The distance X is determined by the electrical characteristics (i.e., its breakdown voltage value). In FIG. 4b, a gate oxide layer 43 is shown as having been formed on the exposed top-portions of the silicon surface 40. The gate oxide layer 43 is a relatively thin layer (preferably 400 Å) of silicon dioxide. A total depth 44 from the top edge of the gate oxide layer 43 to the bottom trench edge is approximately 2.0 microns in this case, but is dependent on, and hence can change with, the device's breakdown voltage. The trenches 41 are etched and the gate oxide layer 43 are uniformly grown over the silicon surface 40 by any well known methods—e.g., photomasking and thermal cycling.

Figure 4C:
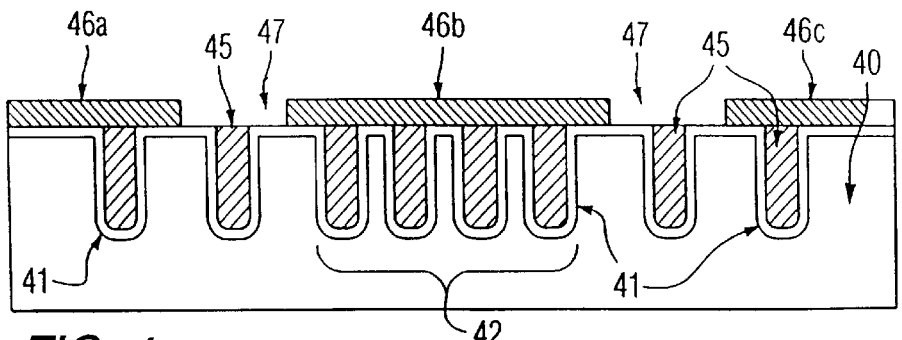

In FIG. 4c, two further deposits are added to the silicon surface 40 of FIG. 4b. First, each trench 41 is back-filled with N type polysilicon 45. Secondly, surface structures 46a, 46b, and 46c are formed, also from N type polysilicon 45. Surface structure 46b is formed so as to be uniformly aligned above the central group of trenches 42. This surface structure 46b formed above the central group 42 is spaced by a gap 47 from the two laterally-placed surface structures 46a and 46c. These surface structures 46a, 46b, and 46c are formed with one trench set aligned in the area between each surface pair, i.e., 45 between 46a and 46b and between 46ba and 46c in preparation of the formation of active MOS transistor devices.

Figure 1:
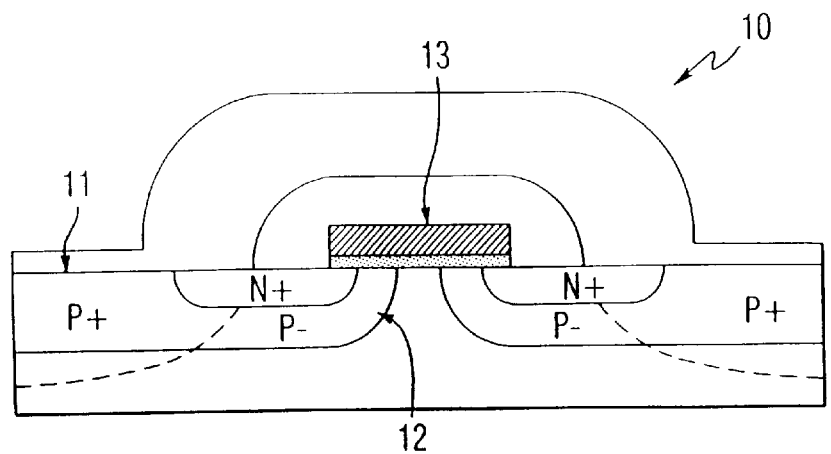
FIG. 1 is a schematic of a prior art planar DMOS unit cell structure.
Figure 2:
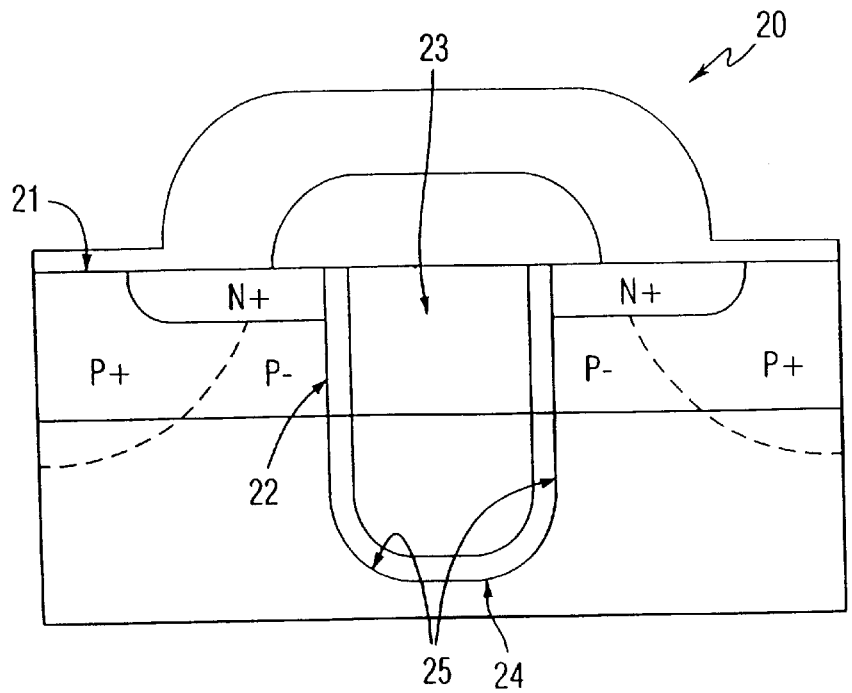
FIG. 2 is a schematic of a prior art trench DMOS device.
Figure 4D:
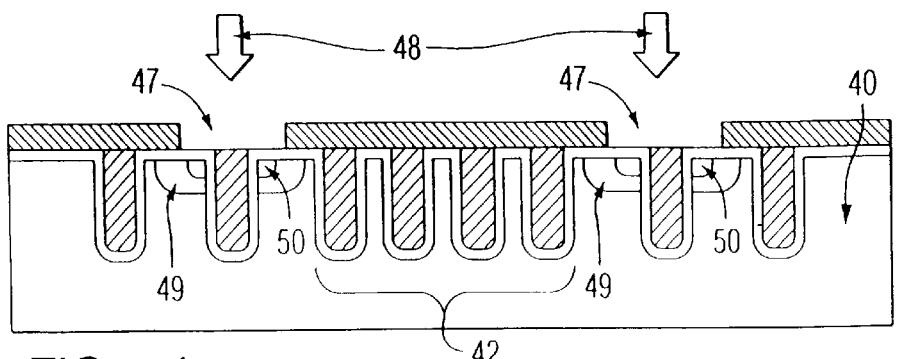

FIG. 4d illustrates well formation through the gaps 47. Ion implants are illustrated by arrows 48. In a well formation similar to that seen in FIG. 2, ion implants 48 are utilized with thermal diffusion to distribute dopant and remove defects so as to form P type wells 49 (Pwells) and N type well (Nwells). Commonly used boron implants and arsenic implants are utilized in the well formation, utilizing any suitable prior art method and are not critical for purposes of disclosing the present invention. The P type wells 49 include channel (P–) and heavy body (P+) material (as also detailed in FIG. 2). The N type wells 50 are formed as source (N+) material. In FIG. 4e, an interlayer dielectric 51 is shown deposited on the silicon surface 40 so as to surround each of the surface structures 46a, 46b, and 46c. The dielectric 51 is preferably boronphosphosilicate glass a (BPSG), but phosphosilicate glass (PSG) may alternatively be used. The dielectric 51 is patterned in such a way so as to form source-metal-contact regions 52a and 52b. Subsequent well-known trench DMOS fabrication steps include the formation of contact ports for forming electrical connection on the double-diffused active devices associated with openings 52a and 52b while isolating the polysilicon material 45 of the trenches therefrom Deposition of a top metal 53 to thereby form sources 54a and 54b is shown in FIG. 4f. Between sources 54a and 54b, there is formed a trench gate signal bus region 55 formed by the gates 58. It can be seen that through layer 46b, all of the individual gates are connected together to establish the single trench gate signal bus region 55. A double-diffused MOS device is thereby formed by the double diffusion of regions 49 and 50 to form the active source regions, and the non-double diffused gate signal bus associated with region 55. A critical distinguishing feature of the present invention is the current conduction path shown by arrows 59. In sharp contrast to the typical lateral conduction path found in conventional MOSFET designs, the current conduction path 59 of the present inventive design is vertically aligned through the epitaxial and substrate layers. The channel junctions are self-aligned to the polysilicon and trenches.

It should be understood that the preferred embodiments mentioned here are merely illustrative of the present invention. The present invention has been described above with reference to a P channel power MOSFET. However, it should be understood that the present invention also encompasses N channel power MOSFETs and their related fabrication methods. Numerous variations in design and use of the present invention may be contemplated in view of the following claims without straying from the intended scope and field of the invention herein disclosed.

I claim:

1. A process for fabricating a power device comprising the steps of:

etching multiple gate bus trenches into a top surface of a semiconductor region of a substrate, said semiconductor region surrounds the trenches and comprises dopant impurities of only one type polarity with a concentration selected to form depleted regions from portions of said semiconductor region bordering the trenches at chosen operating voltages so as to merge together the depleted regions beneath a gate bus disposed above the trenches; depositing an oxide layer uniformly over all exposed surfaces of said trenches and said top surface of said substrate;

depositing a conductive layer in the trenches and over the surface;

patterning the conductive layer by removing selected portions to expose portions of the substrate, to form said gate bus over the trenches and to form one or more gates over other exposed portions of the substrate;

implanting the substrate with first and second implants of opposite conductivities to form wells and source regions in the other exposed portions of the substrate;

depositing a dielectric layer over the substrate;

forming source contact openings in the dielectric layer;

depositing a top metal over said dielectric layer to contact the source regions.

2. The process as claimed in claim 1, wherein the step of forming said trenches comprises forming at least four trenches and wherein said trenches are separated by a predetermined width.

3. The process as claimed in claim 2, wherein said predetermined width is sufficient to create trench field coupling to thereby provide an extended space charge boundary.

4. The process as claimed in claim 1 wherein said step of implanting comprises implanting P type ions to form said wells and implanting N type ions into said wells to form sources.

5. The process of claim 1 wherein the conductive material comprises doped polysilicon.

6. The process of claim 1 wherein the substrate comprises an epitaxial layer for receiving the trenches.

* * * * *